United States Patent
Chen

(10) Patent No.: US 10,872,866 B2
(45) Date of Patent: Dec. 22, 2020

(54) SEMICONDUCTOR PACKAGE AND METHOD OF MANUFACTURING THE SAME

(71) Applicant: Advanced Semiconductor Engineering, Inc., Kaohsiung (TW)

(72) Inventor: Jenchun Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/154,490

(22) Filed: Oct. 8, 2018

(65) Prior Publication Data

US 2020/0111752 A1 Apr. 9, 2020

(51) Int. Cl.
| | |
|---|---|
| H01L 23/552 | (2006.01) |
| H01L 21/683 | (2006.01) |
| H01L 21/56 | (2006.01) |
| H01L 23/31 | (2006.01) |

(52) U.S. Cl.
CPC .......... *H01L 23/552* (2013.01); *H01L 21/56* (2013.01); *H01L 21/6833* (2013.01); *H01L 23/3121* (2013.01)

(58) Field of Classification Search
CPC ... H01L 23/552; H01L 21/56; H01L 21/6833; H01L 23/3121
See application file for complete search history.

(56) References Cited

U.S. PATENT DOCUMENTS

| | | | |
|---|---|---|---|
| 8,315,060 B2 | 11/2012 | Morikita et al. | |
| 8,404,520 B1* | 3/2013 | Chau | .................... H01L 21/4853 438/109 |
| 9,070,793 B2 | 6/2015 | Liao et al. | |
| 9,491,846 B2 | 11/2016 | Ogawa et al. | |
| 2003/0186566 A1* | 10/2003 | Maruyama | ........... G01R 1/0675 439/66 |
| 2015/0179896 A1* | 6/2015 | Huang | .................. H01L 33/486 257/99 |
| 2016/0240503 A1* | 8/2016 | Shu | ...................... H01L 23/3142 |
| 2017/0098623 A1* | 4/2017 | West | ........................ H01L 24/17 |
| 2017/0162516 A1* | 6/2017 | Joh | ........................ H01L 21/565 |
| 2017/0278733 A1* | 9/2017 | Chang | ................. H01L 33/0095 |
| 2018/0374798 A1* | 12/2018 | Lee | ........................ H01L 23/552 |

FOREIGN PATENT DOCUMENTS

KR 10-1332332 B1 11/2013

* cited by examiner

*Primary Examiner* — Fernando L Toledo
*Assistant Examiner* — Neil R Prasad
(74) *Attorney, Agent, or Firm* — Foley & Lardner LLP

(57) ABSTRACT

A semiconductor package including a substrate having a surface, and a conductive element on the first surface and electrically coupled to the substrate. The conductive element has a principal axis forming an angle less than 90 degrees with the surface.

20 Claims, 16 Drawing Sheets

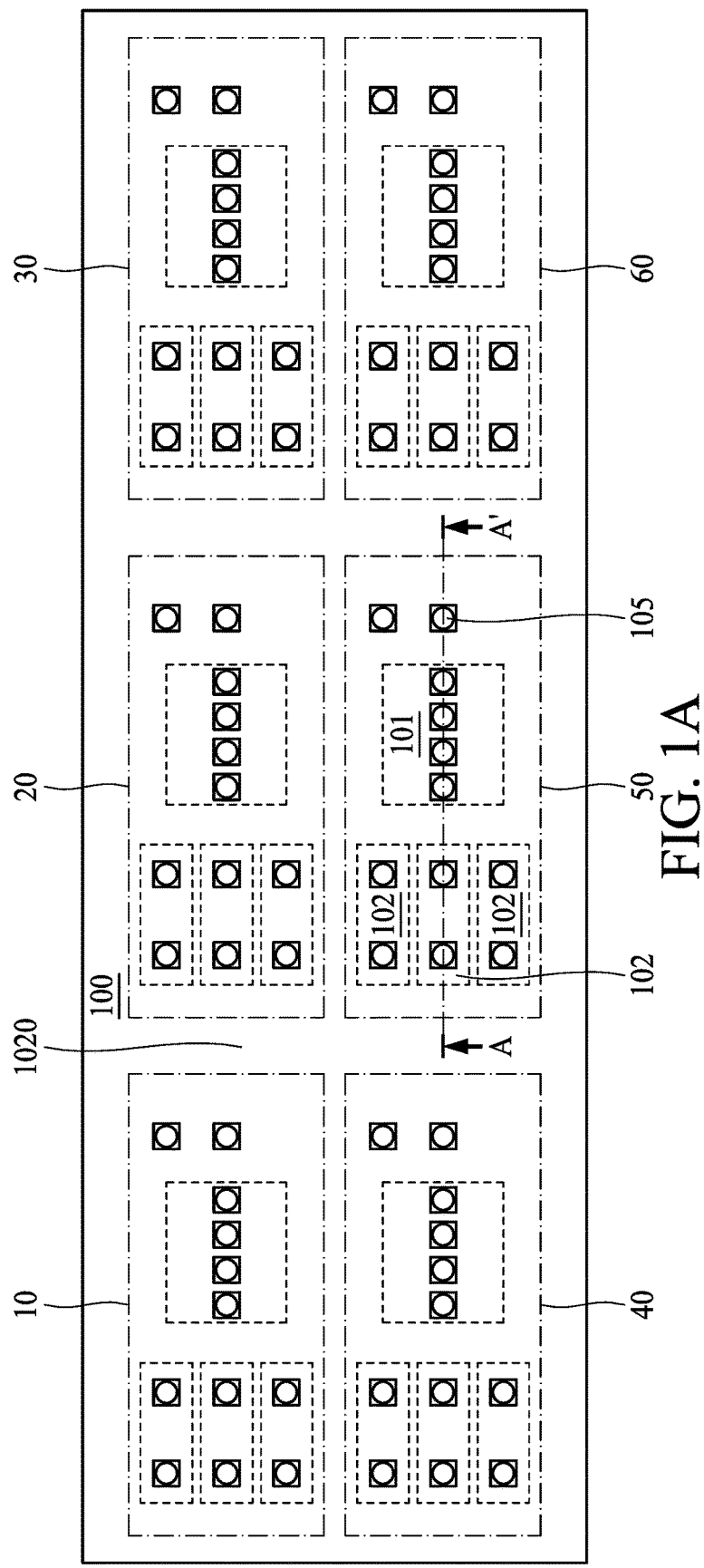
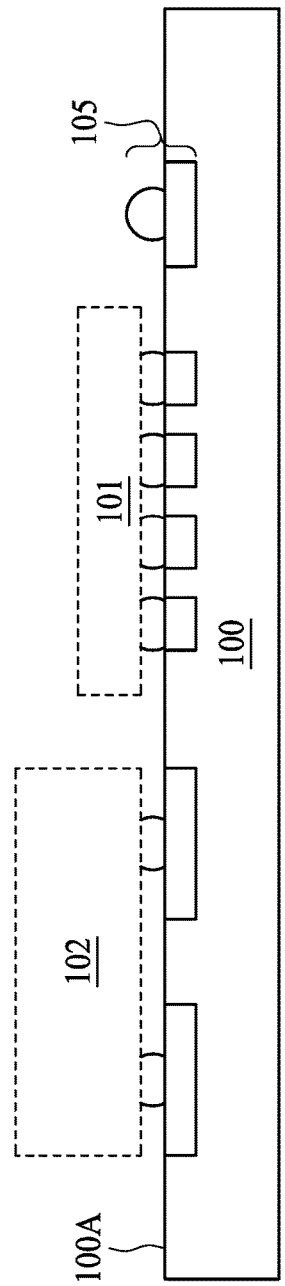
FIG. 1A
FIG. 1B

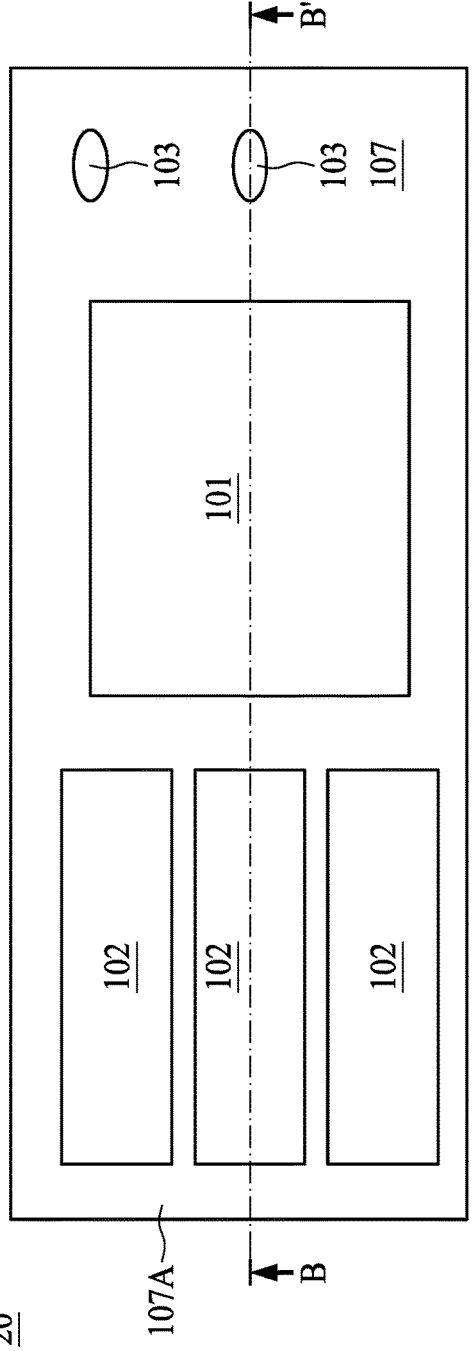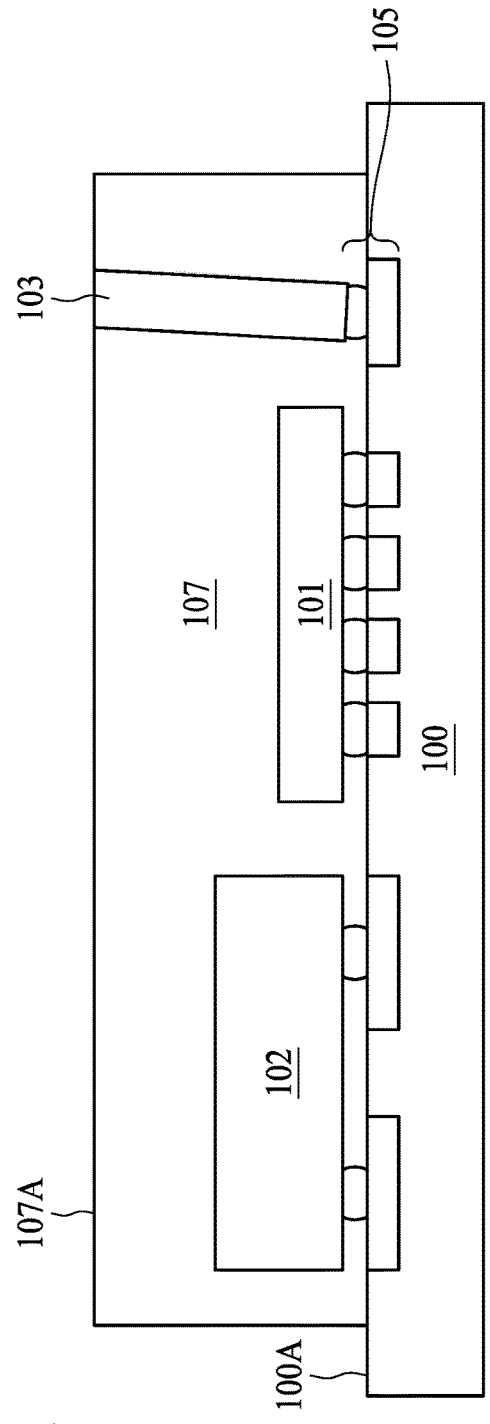

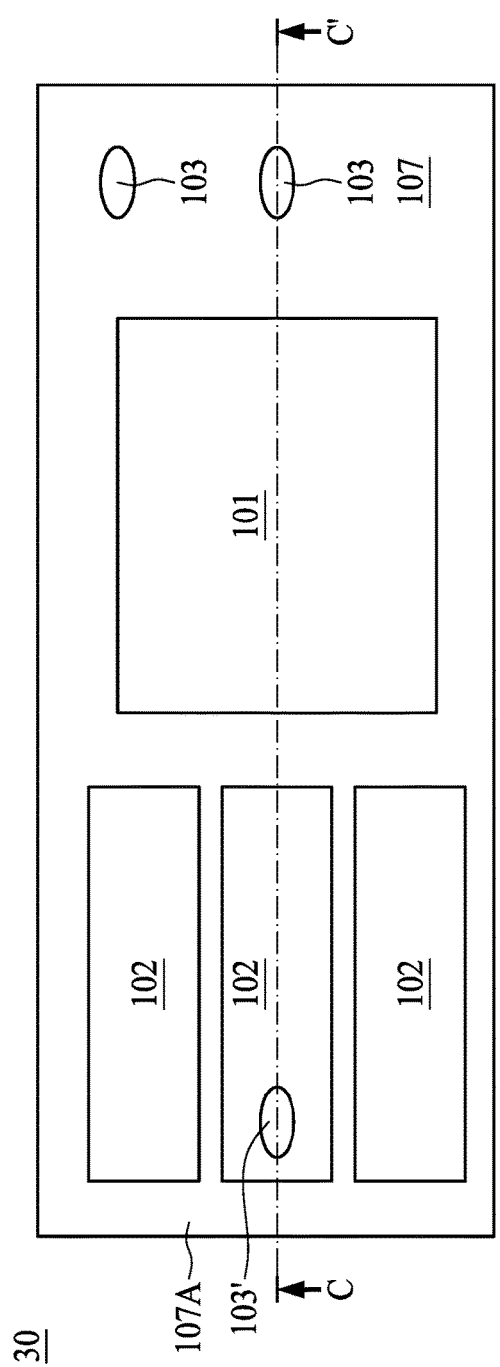
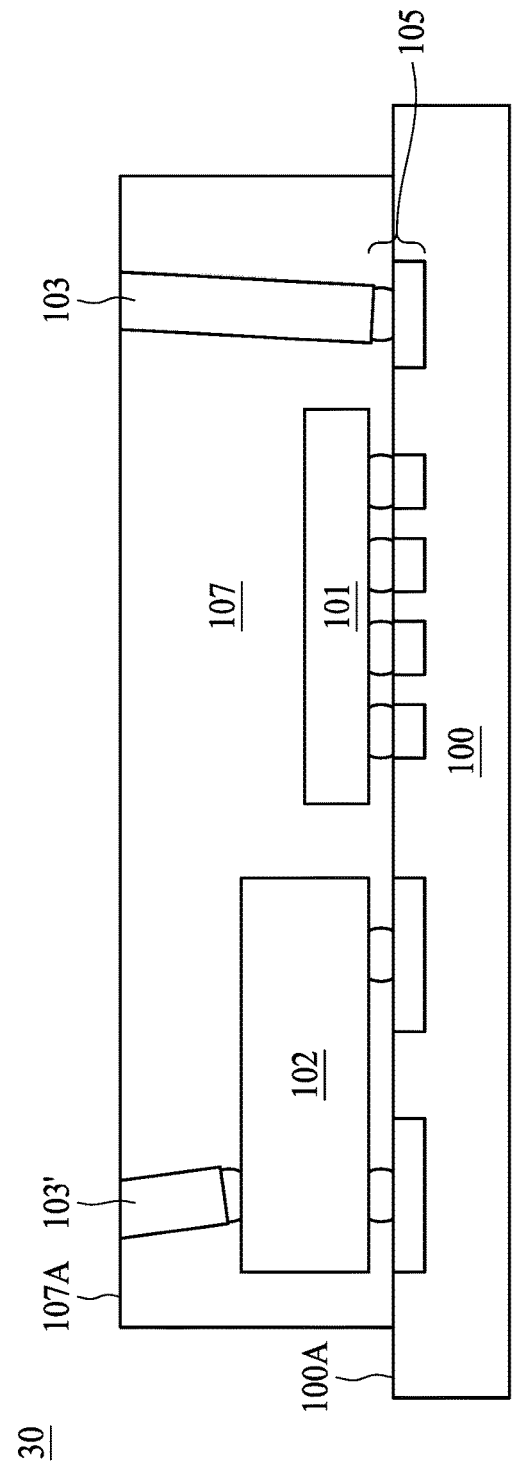
FIG. 3A
FIG. 3B

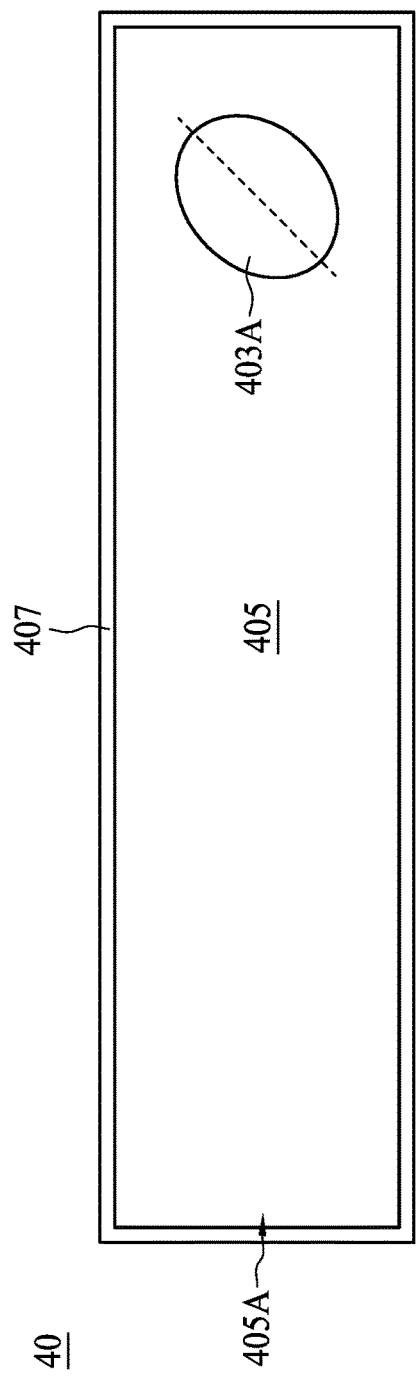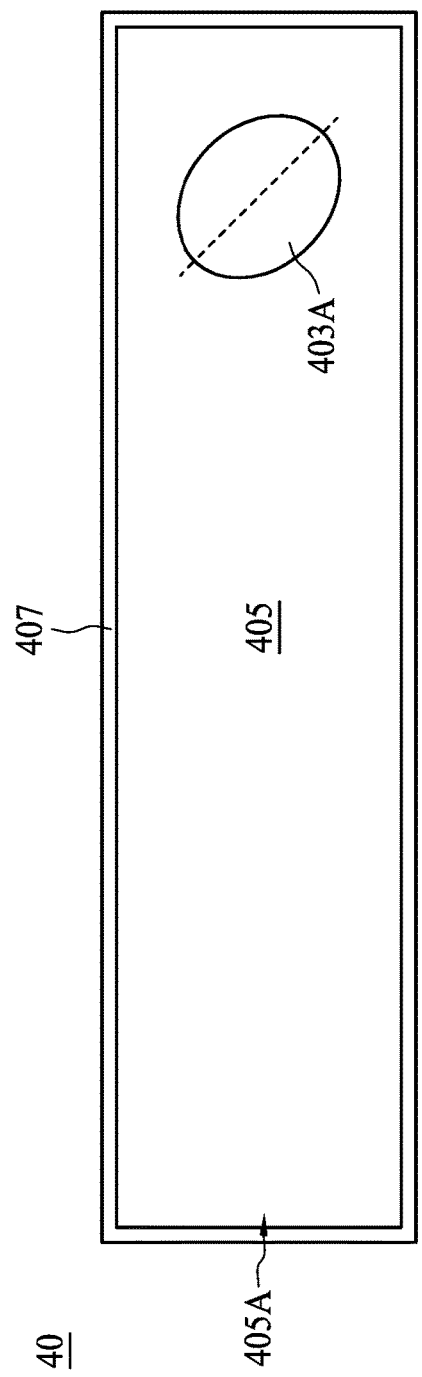

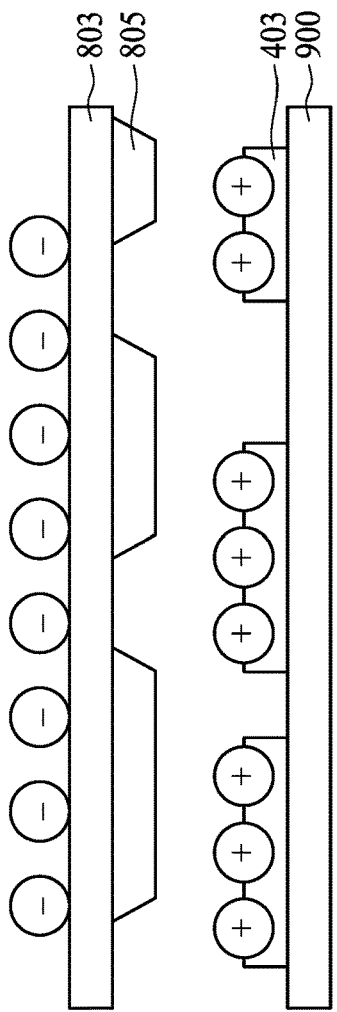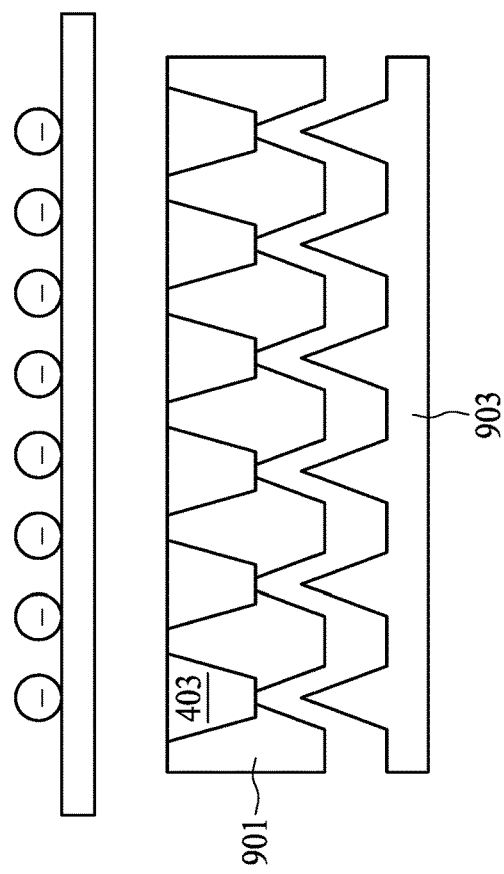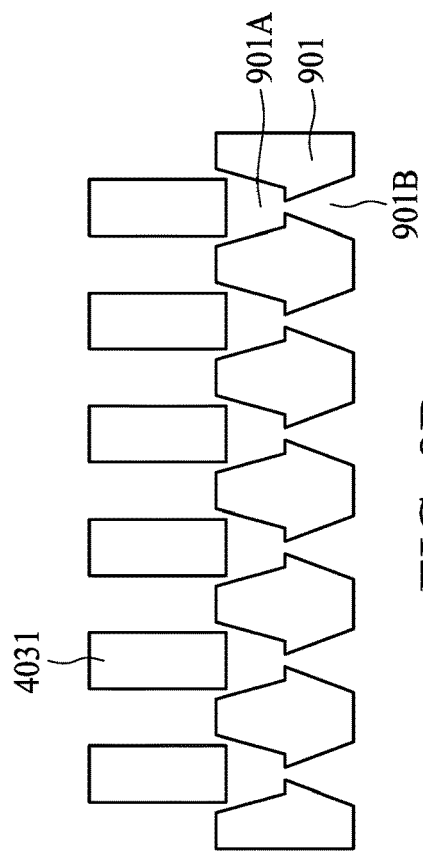

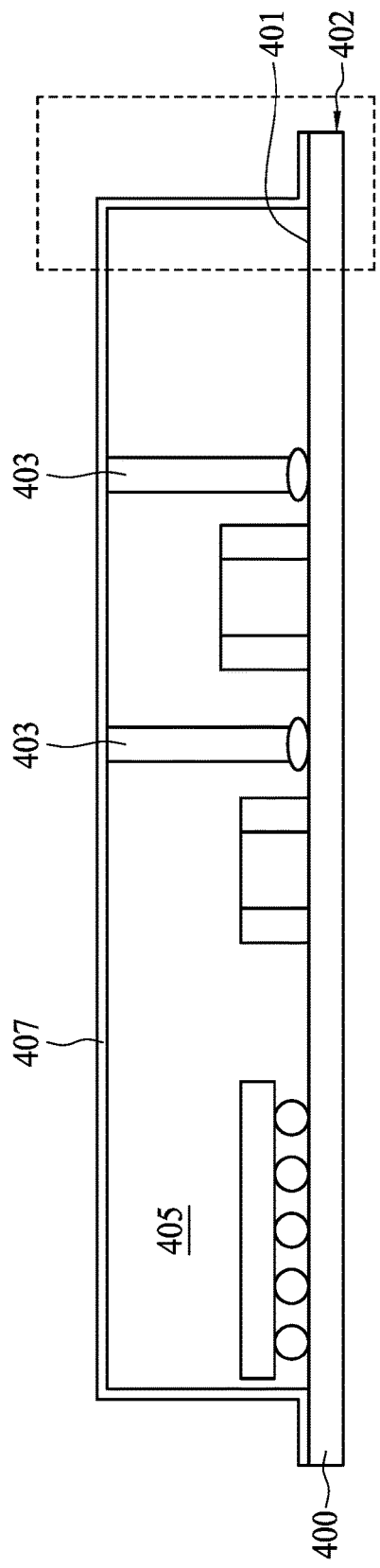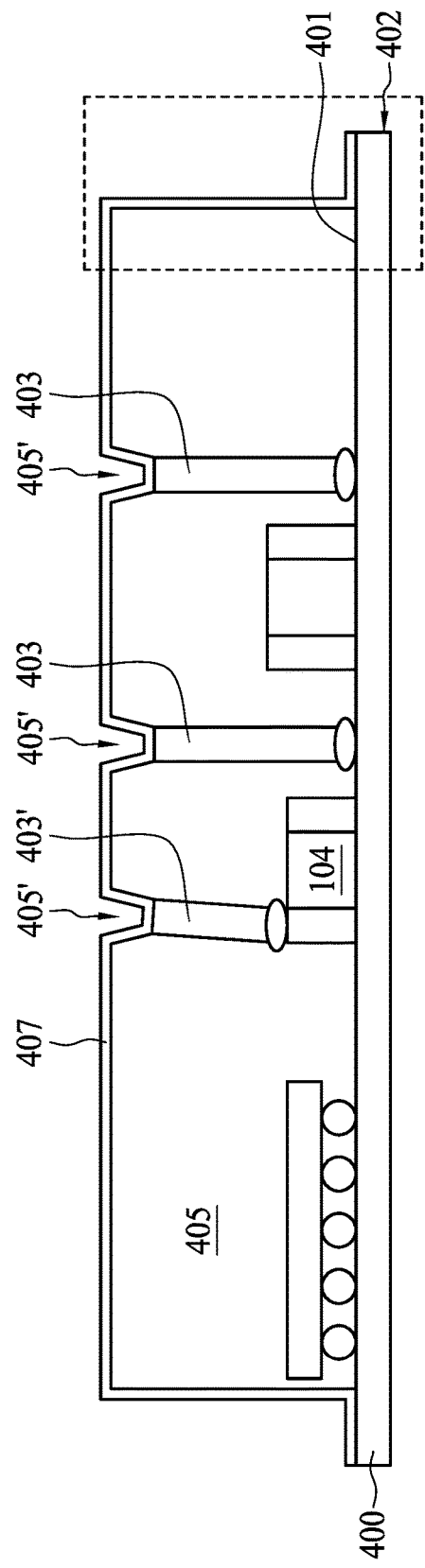
FIG. 14A
FIG. 14B

US 10,872,866 B2

SEMICONDUCTOR PACKAGE AND METHOD OF MANUFACTURING THE SAME

BACKGROUND

As operation speed increases and device size decreases, semiconductor packages may encounter problems with electromagnetic shielding. For example, higher clock speeds cause more frequent signal transitions between different levels, and increase the intensity of electromagnetic emissions under high frequency or short wavelength. Electromagnetic emissions may radiate from one semiconductor device to an adjacent semiconductor device. Electromagnetic interference (EMI) can negatively affect the operation of a semiconductor device if electromagnetic emissions of an adjacent semiconductor device are of high intensity. If an electronic system has a high-density distribution of semiconductor devices, then the EMI among the semiconductor devices becomes even worse.

Along with vehicle applications, machine-to-machine applications, and wearable smart device applications, devices or modules operating at high speed can implement conformal shielding between system and module or between individual modules. Some comparative conformal shielding operations utilize plastic encapsulants and conductive materials, and sputtering or spraying to achieve compartment and electromagnetic shielding. Some of the manufacturing processes for such devices have low production throughputs and high manufacturing costs.

SUMMARY

Some embodiments of the present disclosure provide for a semiconductor package, including a substrate having a surface, and a conductive element on the surface and electrically coupled to the substrate. The conductive element has a principal axis forming an angle less than about 90 degrees with the surface.

Some embodiments of the present disclosure provide for a semiconductor package including a substrate having a first surface, a conductive element on the first surface, the conductive element having a side surface, and an encapsulant covering the side surface of the conductive element. A second surface passes through the conductive element and the encapsulant. The second surface is parallel to the first surface, and the shape of the conductive element on the second surface is elliptical.

Some embodiments of the present disclosure provide for a method for manufacturing a semiconductor package. The method includes providing a substrate having a surface, and placing a conductive element having a principal axis on the surface of the substrate. Placing the conductive element includes picking the conductive element using an electrostatic force, and releasing the conductive element on a position on the surface of the substrate.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

FIG. 1A is a top view of a plurality of semiconductor module areas 10, 20, 30, 40, 50, and 60 on a semiconductor substrate 100, in accordance with some embodiments of the present disclosure.

FIG. 1B is a cross-sectional view along plane AA' in one of the plurality of semiconductor module areas of FIG. 1A, in accordance with some embodiments of the present disclosure.

FIG. 2A is a top view of a semiconductor package during an intermediate manufacturing stage, in accordance with some embodiments of the present disclosure.

FIG. 2B is a cross-sectional view along plane BB' of the semiconductor package of FIG. 2A, in accordance with some embodiments of the present disclosure.

FIG. 3A is a top view of a semiconductor package during an intermediate manufacturing stage, in accordance with some embodiments of the present disclosure.

FIG. 3B is a cross-sectional view along plane CC' of the semiconductor package of FIG. 3A, in accordance with some embodiments of the present disclosure.

FIG. 4C is a top view along plane DD' of the semiconductor package of FIG. 4A, in accordance with some embodiments of the present disclosure.

FIG. 4D is a top view along plane DD' of the semiconductor package of FIG. 4A, in accordance with some embodiments of the present disclosure.

FIG. 9A illustrates an electrostatic (ES) plate and conductive elements for manufacturing a semiconductor package, in accordance with some embodiments of the present disclosure.

FIG. 9B and FIG. 9C illustrate a formation of a conductive element for manufacturing a semiconductor package, in accordance with some embodiments of the present disclosure.

FIG. 14A is a cross-sectional view of a semiconductor package in FIG. 13A after a half-cut and a conductive layer formation operation, in accordance with some embodiments of the present disclosure.

FIG. 14B is a cross-sectional view of a semiconductor package in FIG. 13B after a half-cut and a conductive layer formation operation, in accordance with some embodiments of the present disclosure.

DETAILED DESCRIPTION

Figure 4A:
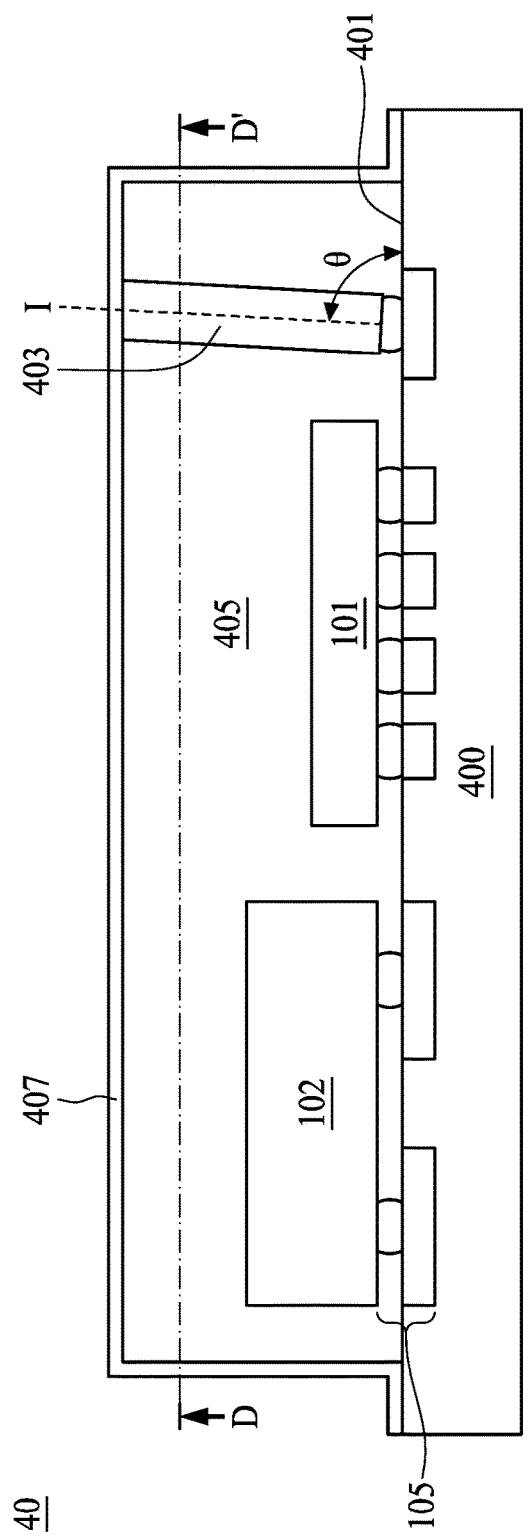
FIG. 4A is cross-sectional view of a semiconductor package, in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

In some integrated circuits (ICs), via structures connecting interconnect metal lines in adjacent layers have diameters of from about 50 micrometers (μm) to about 90 μm. The diameter of via structures affects the series resistance and the heat dissipation rate of an interconnect. In high power application ICs, reducing series resistance and raise heat dissipation rate is desirable in order to achieve better device performance.

Some comparative conformal shielding techniques include connecting a shielding layer with a ground layer exposed at an edge of a substrate, or forming conductive posts connecting with grounded pads by laser drilling an encapsulant and filling conductive material in the drilled holes in the encapsulant. Nevertheless, the former technique involves extending the ground layer to the edge of the substrate, thereby taking up space and occupying the footprint of functional metal lines, while the latter technique has to resolve the issue of voids that may form when filling conductive material in the drilled holes in the encapsulant.

The present disclosure provides for a conductive element connected with a grounded pad on a substrate. The conductive element may be positioned at locations other than the edge of the substrate in a semiconductor package, and the conductive element may be disposed prior to the formation of encapsulant, and so laser drilling may be omitted. Some semiconductor packages may include active and passive electronic devices integrated on the substrate in a fan-out fashion.

FIG. 1A is a top view of a semiconductor substrate 100 having a plurality of semiconductor module areas 10, 20, 30, 40, 50, and 60, in accordance with some embodiments of the present disclosure. In some embodiments, each of the semiconductor module areas defined by imaginary dash-dot lines possesses similar or identical device and wiring layout. For example, each of the semiconductor module areas has a first region exposing conductive terminals 105 configured to receive or bond to an active chip 101 manufactured by wafer-level chip-scale packaging. The top view of the active chip 101 is depicted in dotted lines since the active chip 101 may not yet be bonded to the semiconductor substrate 100 in the depicted example. Each of the semiconductor module areas can also have a second region exposing conductive terminals 105, configured to receive or bond to a plurality of passive devices 102. The top views of the passive devices 102 are depicted in dotted lines since the passive devices 102 may not yet be bonded to the semiconductor substrate 100 yet in the depicted example. Each of the semiconductor module areas can also have a third region exposing several conductive terminals 105. The conductive terminals 105 in the third region are not configured to be bonded to any of the electronic or optical devices. In some embodiments, the conductive terminals 105 in the third region are configured to be bonded to conductive elements, as will be discussed later in the present disclosure. Although depicted at an edge of the semiconductor module area 50, the conductive terminals 105 in the third region can be located in regions other than the edge, for example, between the active chip 101 and the passive device 102.

FIG. 1B is a cross-sectional view along plane AA' in one of the plurality of semiconductor module areas of FIG. 1A, in accordance with some embodiments of the present disclosure. The conductive terminal 105, as illustrated in FIG. 1B, may include a solder bump situated on a corresponding conductive pad in proximity to, adjacent to, or embedded in and exposed at a first surface 100A of the semiconductor substrate 100. In some embodiments, the conductive terminal 105 can include the conductive pad of the semiconductor substrate 100 but may omit the solder bump. Each of the semiconductor module areas 10, 20, 30, 40, 50, and 60 can possess different device and wiring layouts. A saw street 1020 is located between the semiconductor module area 10 and the semiconductor module area 20, and is configured to receive a saw blade during a half-cut or a full-cut singulation operation to separate the semiconductor module areas 10, 20, 30, 40, 50, and 60 after semiconductor packages are completed on the semiconductor substrate 100.

In FIG. 1A and FIG. 1B, the semiconductor substrate 100 is a fan-out substrate. A fan-out substrate in a fan-out wafer level package (FOWLP) is provided for a device with multiple chips. In an embodiment, the fan-out substrate includes one or more redistribution layers (RDLs) which comprises one or more conductor portions and one or more insulator or dielectric portions. In an embodiment, the fan-out substrate may include interposer-like wirings after assembly with a wafer level packaging (WLP) process to form a structure which may be regarded as an interposing FOWLP. A plurality of chips may be provided on the fan-out substrate, and one or more integrated circuits may be embedded in each of the chips in the FOWLP.

FIG. 2A is a top view of a semiconductor package 20 during an intermediate manufacturing stage, in accordance with some embodiments of the present disclosure. As previously discussed in FIG. 1A and FIG. 1B, an active chip 101, a passive device 102, and a conductive element 103 are bonded to the semiconductor substrate 100 through conductive terminals 105, and these components are encapsulated by an encapsulant 107, or a molding compound. As shown in FIG. 2A, a top view of the conductive element 103 at a planarized surface 107A of the encapsulant 107 can be elliptical in shape due to the fact that the conductive element 103 may be slanted during the manufacturing operation.

FIG. 2B is a cross-sectional view dissecting along plane BB' of the semiconductor package 20 of FIG. 2A, in accordance with some embodiments of the present disclosure. In some embodiments, the conductive element 103 may be a metal pin that includes a metal conductor, such as copper (Cu), a Cu alloy in which iron (Fe) is mixed with the Cu in a ratio in a range from about 0.1% to about 20%, gold (Au), silver (Ag), or aluminum (Al), or an alloy thereof. The conductive element 103 may be a pin having an average diameter of about 50 μm. The conductive element 103 is connected to a conductive pad proximal to, adjacent to, or embedded in and exposed at the first surface 100A of the semiconductor substrate 100 through a solder bump. The conductive pad may have a width greater than that of the diameter of the conductive element 103 by at least about 50 μm. For example, a widest dimension of the conductive pad receiving the conductive element is about equal to or greater than about 100 μm. As another example, a widest dimension of a grounded conductive pad receiving the conductive element is about equal to or greater than about 200 μm.

FIG. 3A is a top view of a semiconductor package 30 during an intermediate manufacturing stage, in accordance with some embodiments of the present disclosure. As previously discussed in FIG. 1A and FIG. 1B, an active chip 101, a passive device 102, and a first conductive element 103 are bonded to the semiconductor substrate 100 through conductive terminals 105, and these components are encapsulated by an encapsulant 107, or a molding compound. As shown in FIG. 3A, a top view of the first conductive element 103 and the second conductive element 103' at a planarized surface 107A of the encapsulant 107 can have an elliptical shape due to the fact that the first conductive element 103 and the second conductive element 103' may be slanted during the manufacturing operation. However, one of the first conductive element 103 and the second conductive element 103' can have a circular shape at the planarized surface 107A of the encapsulant 107, if one of the first conductive element 103 and the second conductive element 103' does not slant during the manufacturing operations.

Difference between FIG. 2A and FIG. 3A include that a second conductive element 103' is bonded to a top surface of the passive device 102. In some embodiments, the second conductive element 103' is shorter than the first conductive element 103 in a principal direction and the second conductive element 103' is electrically connected to the semiconductor substrate 100 through a solder joint at the top surface of the passive device 102. However, the second conductive element 103' is not limited to the embodiments explicitly described herein. The second conductive element 103' can be electrically connected to or directly bonded to any of the semiconductor chips or devices integrated with the semiconductor substrate 100.

FIG. 3B is a cross-sectional view along plane CC' of the semiconductor package 30 of FIG. 3A, in accordance with some embodiments of the present disclosure. In some embodiments, the first conductive element 103 and the second conductive element 103' may be metal pins that include a metal conductor, such as Cu, a Cu alloy in which Fe is mixed into Cu by a ratio in a range from about 0.1% to about 20%, Au, Ag, or Al, or an alloy thereof. The first conductive element 103 and/or the second conductive element 103' may be a metal pin having an average diameter of about 50 μm. The first conductive element 103 is connected to a conductive pad of the semiconductor substrate 100 through a solder bump. The second conductive element 103' is connected to a conductive pad of the passive device 102 or an active device (not shown in FIG. 3B) through a solder bump. The conductive pad may have a width greater than that of the diameter of the first and second conductive elements 103, 103' by at least about 50 μm. For example, a widest dimension of the conductive pad receiving the first and second conductive elements 103, 103' is about equal to or greater than about 100 μm. As another example, a widest dimension of a grounded conductive pad receiving the conductive element is about equal to or greater than about 200 μm.

As illustrated in FIG. 3B, the first conductive element 103 can be slanted toward the right while the second conductive element 103' can be slanted toward a different direction, for example, the left. The tilting action of the first conductive element 103 and the second conductive element 103' occurs during solder reflow operation as will be subsequently addressed in FIG. 11 of the present disclosure. In some embodiments, a slanted angle θ, an acute angle measured between the first conductive element 103 and the first surface 100A of the semiconductor substrate 100, is from about 85 degrees to less than about 90 degrees (e.g. from about 86 degrees to about 89 degrees, or from about 87 degrees to about 88 degrees). The slanted angle may be determined by an opening of a mask used in manufacturing as opposed to the diameter of the first conductive element 103, as will be subsequently addressed in FIG. 10A of the present disclosure.

FIG. 4A is cross-sectional view of a semiconductor package 40, in accordance with some embodiments of the present disclosure. Semiconductor substrate 400 can be a fan-out substrate, as previously described in FIG. 1B. The semiconductor substrate 400 has a first surface 401 receiving the active device 101, the passive device 102, and the conductive element 403. As shown in FIG. 4A, the conductive element 403 has a principal axis I intersecting with the first surface 401. The principal axis I and the first surface 401 form an acute angle, or an angle θ, less than about 90 degrees (e.g. from about 86 degrees to about 89 degrees, or from about 87 degrees to about 88 degrees). The active device 101, the passive device 102, and the conductive element 403 are encapsulated in an encapsulant 405, for example, in polymer-based materials or molding compounds. The encapsulant 405 covers a side surface or a lateral surface of the conductive element 403, as well as the first surface 401 of the semiconductor substrate 400. The active device 101, the passive device 102, and the conductive element 403 are electrically coupled to at least one of the RDLs of the semiconductor substrate 400. As shown in FIG. 4A, a vertical height of the conductive element 403 is substantially the same as a vertical height of the encapsulant 405.

In FIG. 4A, a conductive layer 407 is conformally formed on a top and a side of the encapsulant 405 and the first surface 401 of the semiconductor substrate 400. Being in physical contact with the conductive element 403, the conductive layer 407 is electrically coupled to at least one of the RDLs of the semiconductor substrate 400. In some embodiments, the conductive layer 407 serves as a conformal shielding of the semiconductor package 40, where the conductive terminal 105 receiving the conductive element 403 is grounded. In some embodiments, tilted conductive element 403 embedded in the encapsulant 405 can be perceived by a non-destructive manner such as X-ray screening.

Figure 4B:
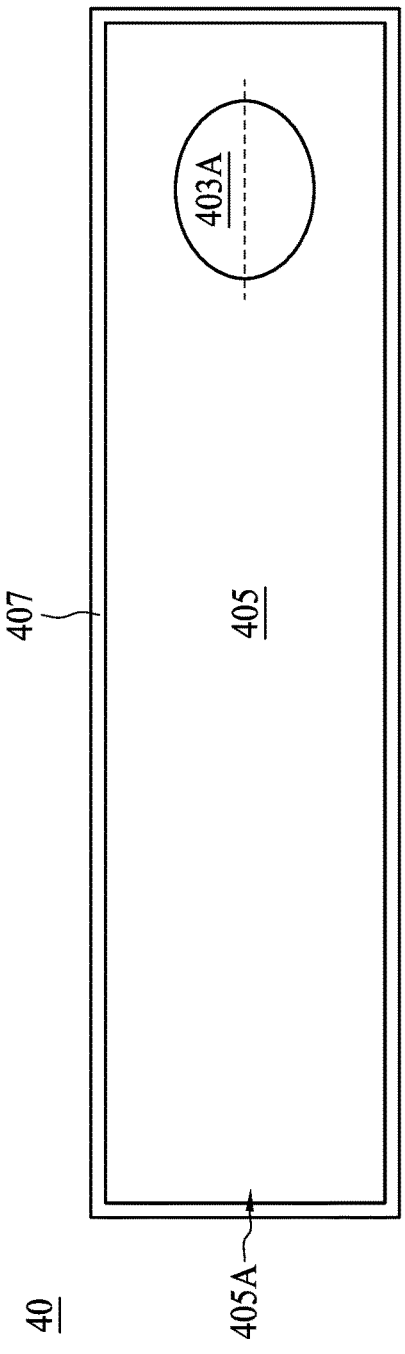
FIG. 4B is a top view along plane DD' of the semiconductor package of FIG. 4A, in accordance with some embodiments of the present disclosure.

FIG. 4B is a top view along plane DD' of the semiconductor package 40 of FIG. 4A, in accordance with some embodiments of the present disclosure. FIG. 4B shows a second surface 405A of the semiconductor package 40 parallel to the first surface 401 of FIG. 4A. The second surface 405A need not be exposed to an outside of the semiconductor package 40, and may be an imaginary plane. The second surface 405A at least includes or passes through the encapsulant 405 and the conductive element 403. In some embodiments, any surface or plane between the top surface of the encapsulant 405 and the first surface 401 can be a second surface 405A. The conductive element 403 exposes an elliptical-shaped area 403A at the second surface 405A (e.g. due to the fact that the conductive element 403 is slanted during the manufacturing operations). An orientation of a long axis of the elliptical-shaped area 403A depends on how the conductive element 403 is tilted during the manufacturing operations. For example, in FIG. 4B, the long axis of the elliptical-shaped area 403A extends from left to right, and thus the corresponding conductive element 403 may be slanted toward the left or the right. In FIG. 4C, the long axis of the elliptical-shaped area 403A extends from the lower left to the upper right, and thus the corresponding conductive element 403 may be slanted toward the lower left or the upper right. In FIG. 4D, the long axis of the elliptical-shaped area 403A extends from the upper left to the lower right, and thus the corresponding conductive element 403 may be slanted toward the upper left or the lower right.

Figure 5A:
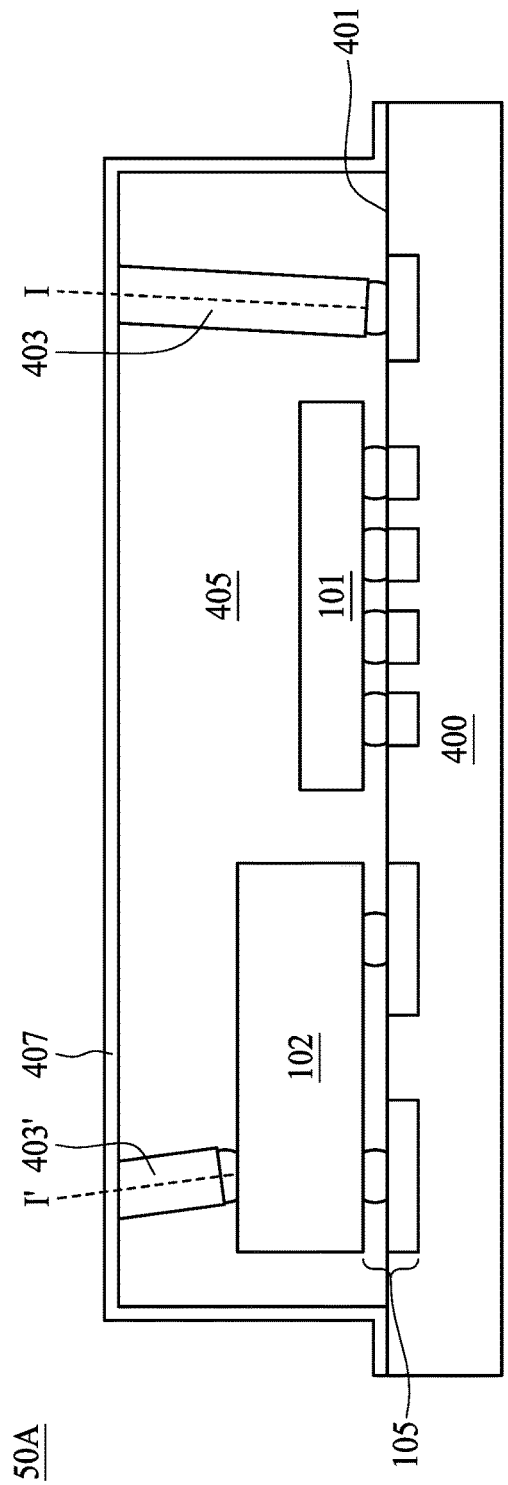
FIG. 5A is a cross-sectional view of a semiconductor package, in accordance with some embodiments of the present disclosure.

FIG. 5A is a cross-sectional view of a semiconductor package 50A, in accordance with some embodiments of the present disclosure. Compared to the semiconductor package 40 in FIG. 4A, the semiconductor package 50A has an additional second conductive element 403' situated over the passive device 102. The first conductive element 403 and the second conductive element 403' have different lengths in the principal directions, I and I'. In some embodiments, the conductive layer 407 is conformally formed on the a top and a side of the encapsulant 405 and the first surface 401 of the semiconductor substrate 400. Being in physical contact with the first conductive element 403 and the second conductive element 403', the conductive layer 407 is electrically coupled to at least one of the RDLs of the semiconductor substrate 400. In some embodiments, the conductive layer 407 serves as a conformal shielding of the semiconductor package 50A, where the conductive terminal 105 receiving the first conductive element 403 and/or the conductive terminal receiving the second conductive element 403' on the passive device 102 are/is grounded. Grounded terminals on the passive device 102 can be connected to an end of the second conductive element 403'. In some embodiments, the first conductive element 403 and the second conductive element 403' are metal rods, each having a substantially uniform diameter from one end to the other.

Figure 5B:
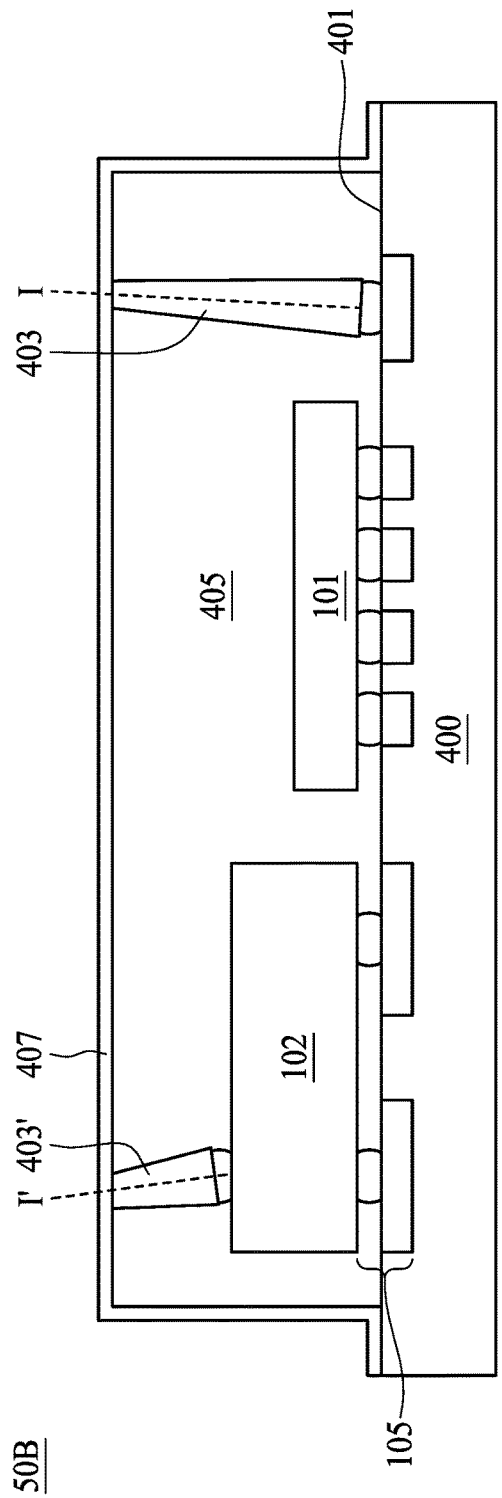
FIG. 5B is a cross-sectional view of a semiconductor package, in accordance with some embodiments of the present disclosure.

FIG. 5B is a cross-sectional view of a semiconductor package 50B, in accordance with some embodiments of the present disclosure. Differences between semiconductor package 50B and semiconductor package 50A include that in semiconductor package 50B, the first conductive element 403 and the second conductive element 403' are tapered metal rods, each having a first end in contact with the conductive layer 407 and a second end in contact with a solder bump. The first conductive element 403 and the second conductive element 403' are tapered along the principal axes, I and I'. In some embodiments, the first end is narrower than the second end, providing for a tapered rod having a wider bottom and a narrower top. The tapered conductive element is advantageous for maintaining an upright position of the conductive element during reflow operation since the configuration of a wider bottom and a narrower top is less likely to incline when joining to molten solder. Tapered metal rods can be manufactured using a forging operation in combination with electrostatic (ES) force manipulation, as will be discussed in FIG. 9B and FIG. 9C of the present disclosure.

Figure 6:
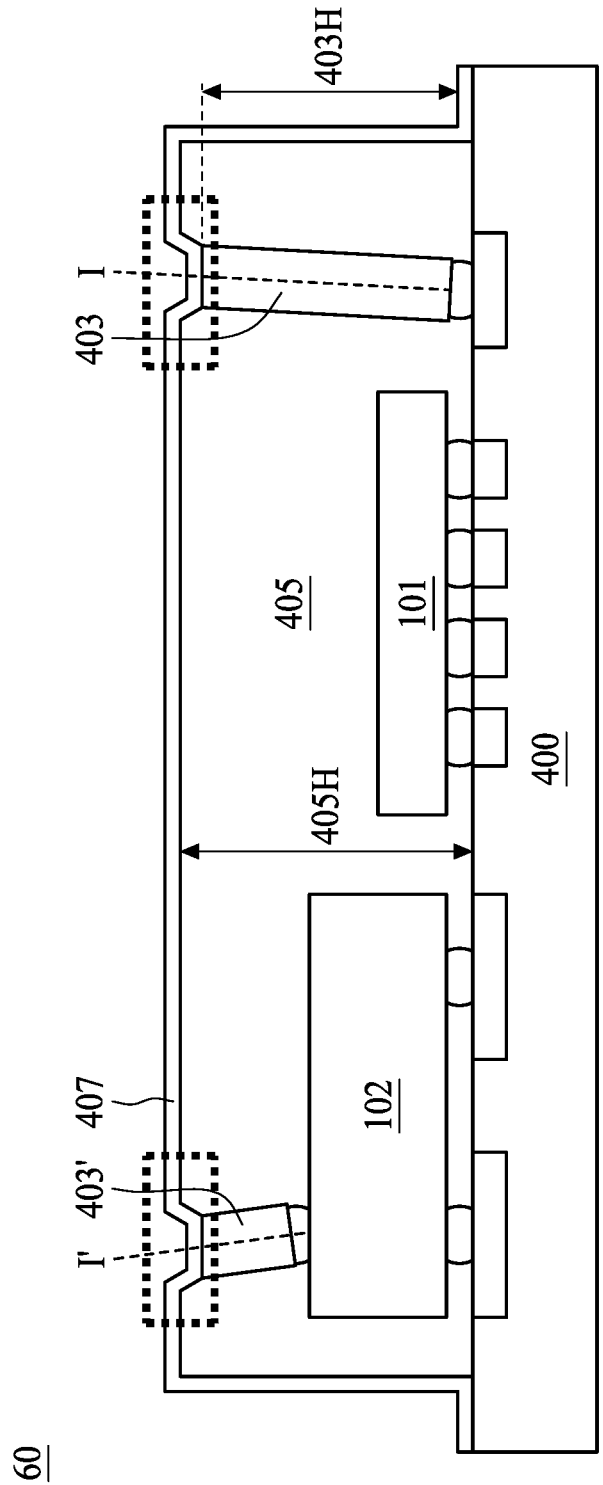
FIG. 6 is a cross-sectional view of a semiconductor package, in accordance with some embodiments of the present disclosure.

FIG. 6 is a cross-sectional view of a semiconductor package 60, in accordance with some embodiments of the present disclosure. Compared to the semiconductor package 50A in FIG. 5A, a height 405H of the encapsulant 405 in the semiconductor package 60 is greater than a vertical height 403H of the first conductive element 403 in contact with at least one of the RDLs of the semiconductor substrate 400. The encapsulant 405, the first conductive element 403, and the second conductive element 403' in the semiconductor package 50A have a coplanar top surface, as a result of a planarization operation thinning the encapsulant 405, the first conductive element 403, and the second conductive element 403' simultaneously. On the other hand, the encapsulant 405, the first conductive element 403, and the second conductive element 403' in the semiconductor package 60 do not share a coplanar surface. The encapsulant 405 defines a recess proximal to a top end of the first conductive element 403 and a top end of the second conductive element 403'. Details of the recess of the encapsulant 405 will be further described in FIG. 7A and FIG. 7B.

Figure 7A:
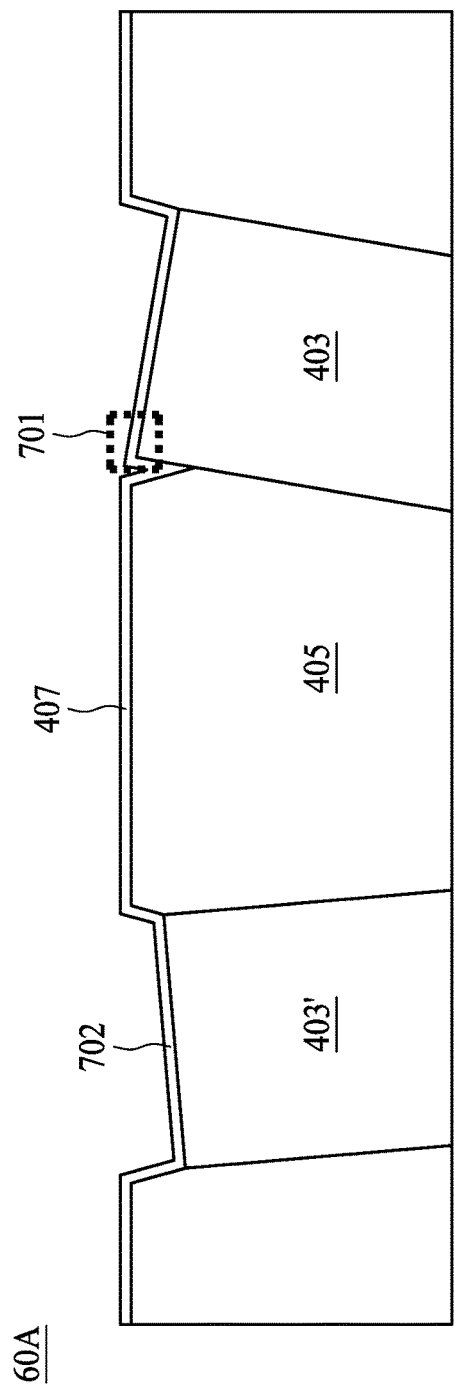
FIG. 7A is a cross-sectional view of a semiconductor package showing an enlargement of a top of a conductive element of FIG. 6, in accordance with some embodiments of the present disclosure.
Figure 7B:
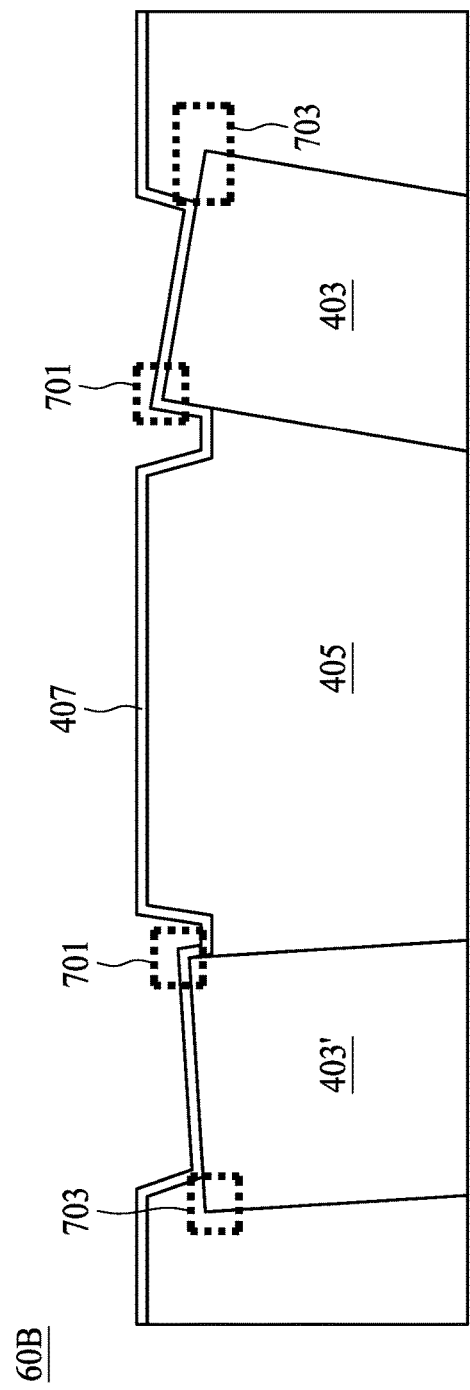
FIG. 7B is a cross-sectional view of a semiconductor package showing an enlargement of a top of a conductive element of FIG. 6, in accordance with some embodiments of the present disclosure.

FIG. 7A and FIG. 7B are cross-sectional views of a semiconductor package 60A showing an enlargement of a top of first and second conductive elements 403, 403' of FIG. 6, in accordance with some embodiments of the present disclosure. In some embodiments, the recess of the encapsulant 405 exposes at least a portion of the first and second conductive elements 403 and 403' and covers another portion (e.g. a remainder) of the first and second conductive element 403 and 403'. As illustrated in FIG. 7B, the portion 703 of the first and second conductive elements 403 and 403' is not exposed from the recess of the encapsulant 405. In some embodiments, the recess exposes a kink (e.g. including a corner or protrusion) of the first and second conductive elements 403 and 403'. As illustrated in FIG. 7A and FIG. 7B, a kink 701 of the first and second conductive elements 403 and 403' is exposed from the recess of the encapsulant 405 due to the fact that the recess is misaligned to the top end of the first and second conductive elements 403 and 403', and the kink 701 defines a top and sidewall of the first and second conductive elements 403 and 403'. In some embodiments, the recess exposes a slanted surface of the first and second conductive elements 403 and 403'. For example, a slanted surface 702 of the second conductive element 403' in FIG. 7A is exposed by the recess as a result of a good alignment of the recess and the underlying second conductive element 403'. A conductive layer 407 is subsequently deposited over the encapsulant 405 and the exposed portion of the first and second conductive elements 403 and 403', delineating a top contour of the semiconductor package.

In some embodiments, recess formation in the encapsulant 405 can be conducted by laser drilling. In addition, laser drilling utilizing a specific wavelength band can selectively remove polymeric or organic materials such as the encapsulant 405 and not the first and second conductive elements 403 and 403', which can include, for example, copper or copper alloys. Therefore, depending on the alignment of the laser drilling, kinks or slanted surfaces or unexposed portions of the first and second conductive elements 403 and 403' may occur.

Figure 8A:
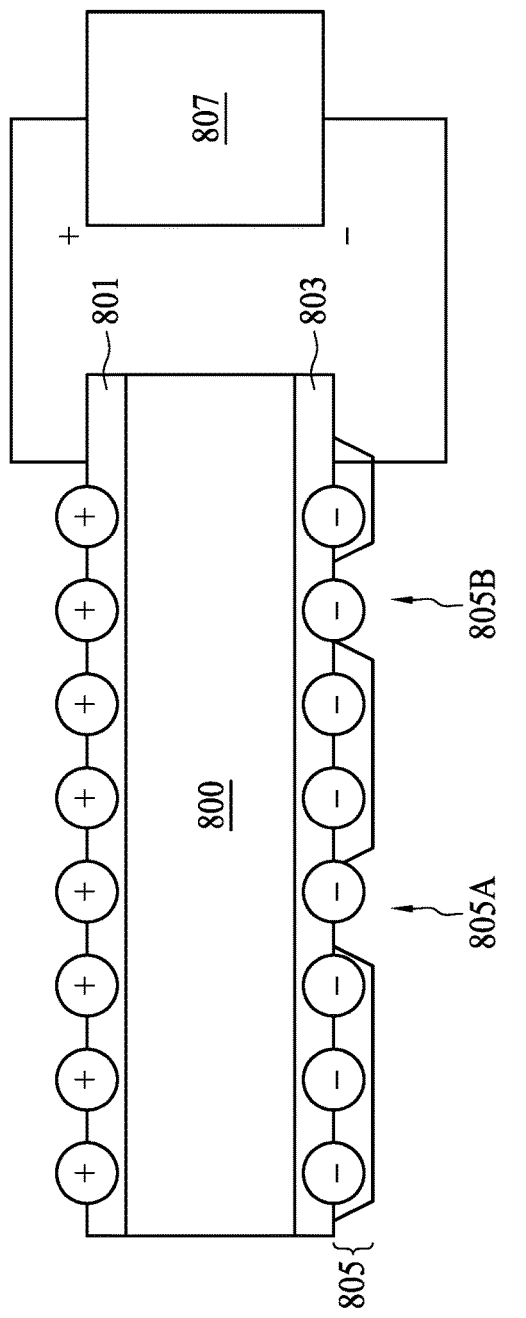
FIG. 8A illustrates an electrostatic (ES) plate for manufacturing a semiconductor package, in accordance with some embodiments of the present disclosure.
Figure 8B:
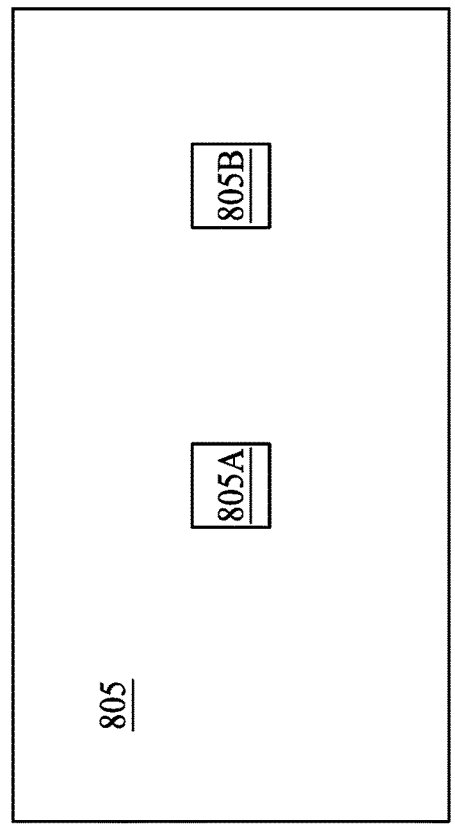
FIG. 8B illustrates a top view of an isolation layer of the electrostatic (ES) plate of FIG. 8A, in accordance with some embodiments of the present disclosure.

FIG. 8A illustrates an electrostatic (ES) plate for manufacturing a semiconductor package, and FIG. 8B illustrates a top view of an isolation layer of the electrostatic (ES) plate of FIG. 8A, in accordance with some embodiments of the present disclosure. The ES plate of FIG. 8A includes a dielectric plate 800 with a top electrode 801 and a bottom electrode 803. Two opposite terminals of an ES generator 807 are coupled to the top electrode 801 and the bottom electrode 803, respectively, and generate electrostatic charges at the surface thereon. The amount of ES charge on the top electrode 801 and the bottom electrode 803 is tunable by the ES generator. A patterned isolation layer 805 is at a surface of the bottom electrode 803. A plurality of openings 805A, 805B in the isolation layer 805, configured to expose predetermined portions of the bottom electrode 803, are shown in FIG. 8B. The portion of the bottom electrode 803 exposed from the openings 805A, 805B can induce polarization of the objects to be attracted and exert ES force on the objects to be attracted. As illustrated in FIG. 8A, as an example, the bottom electrode 803 bears negative static charges while the top electrode 801 bears positive static charges.

Compared to magnetic force, the ES force proposed in the present disclosure can be applied on insulator or non-magnetic materials such as copper, while magnetic force may be used to manipulate insulating or non-magnetic objects. ES force is better suited to carry out present operations when the conductive element 403 is a copper rod or copper needle.

In some embodiments, locations of the patterned openings 805A, 805B are predetermined to match with the locations where the conductive element stands in the semiconductor packages described herein. Patterned openings 805A, 805B are also predetermined to match with another set of openings of a mask helping the conductive element to be properly disposed at the location where the conductive element stands in the semiconductor packages as described herein. Thus an area of the openings 805A, 805B is large enough to accommodate the conductive element at its end, but small enough to prevent a plurality of conductive elements from being attracted to or accommodated in individual openings 805A, 805B.

FIG. 9A illustrates an electrostatic (ES) plate and conductive elements 403 for manufacturing a semiconductor package, in accordance with some embodiments of the present disclosure. The conductive element 403 is disposed on a working table 900 and may be attracted by ES force. When the negative static charge-bearing bottom electrode 803 of the ES plate approaches positive static charge-bearing conductive elements 403, an end of the conductive element 403 is prone to be attracted to the portion of the bottom electrode 803 exposed by the openings of the isolation layer 805.

FIG. 9B and FIG. 9C illustrate a formation of a conductive element for manufacturing a semiconductor package, in accordance with some embodiments of the present disclosure. In FIG. 9B, a mold chase 901 having a feeding end 901A and an ejection end 901B is provided. Conductive materials 4031 such as metal rods or metal needles are fed into the feeding end 901A of the mold chase 901, followed by a forging operation to reshape the conductive element 403 from a rod or needle shape to a tapered rod or tapered needle shape, as shown in FIG. 9C. In some embodiments, a set of thimbles 903 enter the ejection end 901B to eject the tapered rod or tapered needle shape conductive element 403 from the mold chase 901. The ejected tapered rod or tapered needle shape conductive element 403 can then be picked up by ES force exerted from a ES plate, as previously discussed. The tapered feeding end 901A of the mold chase 901 facilitates the de-mold or ejection of the tapered rod or tapered needle shape conductive element 403.

Referring back to FIG. 5B, a wider end of the tapered rod or tapered needle shape conductive element 403 may be joined with the solder bump on the substrate 400 while a narrower end of the tapered rod or tapered needle shape conductive element 403 extends away from the substrate 400 and is electrically connected with the conductive layer 407.

Figure 10A:
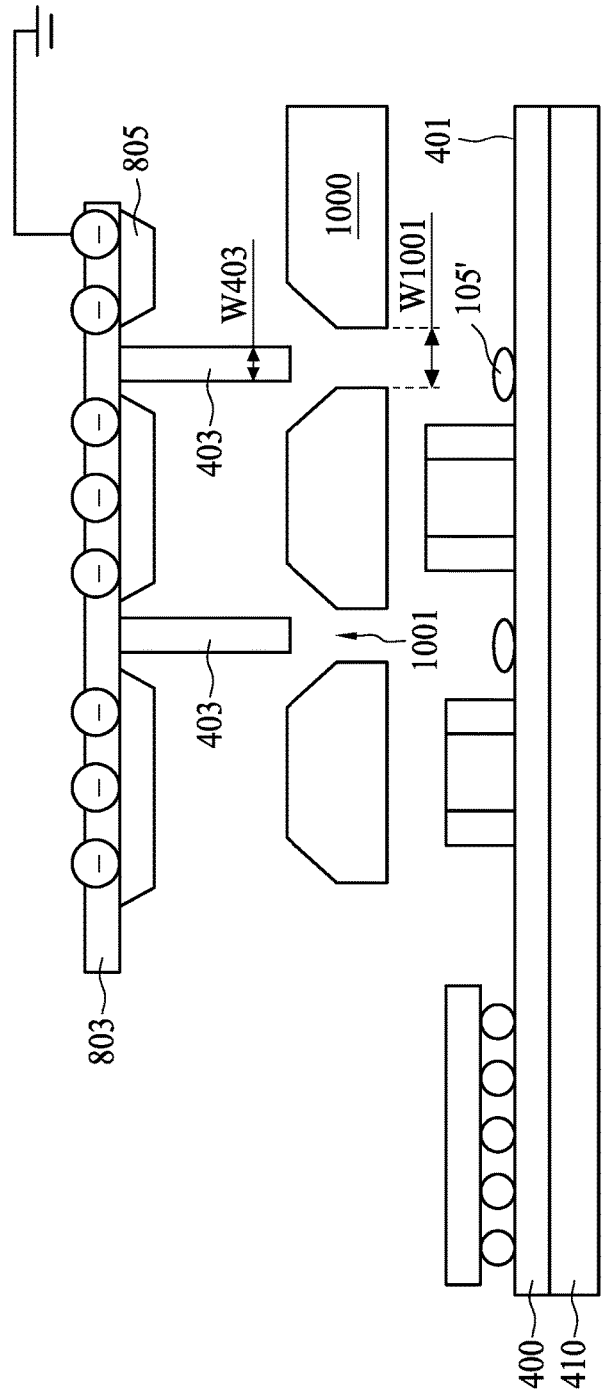
FIG. 10A illustrates an electrostatic (ES) plate, a conductive element, and a mask for manufacturing a semiconductor package, in accordance with some embodiments of the present disclosure.
Figure 10B:
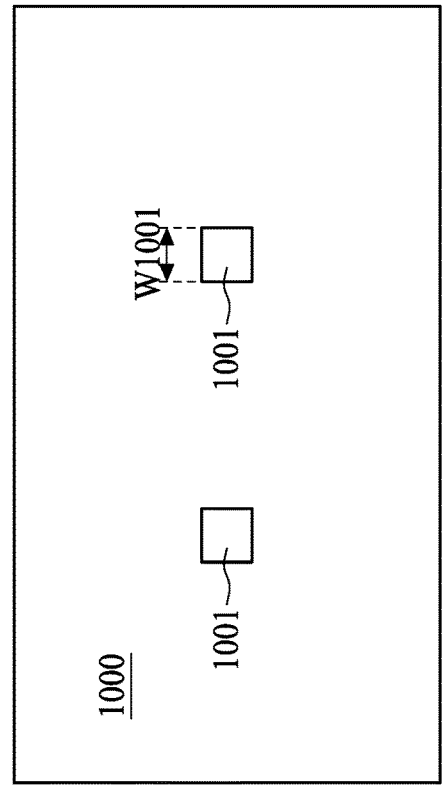
FIG. 10B illustrates a top view of the mask of FIG. 10A, in accordance with some embodiments of the present disclosure.

FIG. 10A illustrates an electrostatic (ES) plate, a conductive element 403, a carrier 410, and a mask 1000 for manufacturing a semiconductor package, and FIG. 10B illustrates a top view of the mask 1000 of FIG. 10A, in accordance with some embodiments of the present disclosure. Subsequent to attracting the first conductive element 403 using ES force at the bottom electrode 803, a first mask 1000 having a first pattern, as shown in FIG. 10B, corresponding to the pattern of the isolation layer 805, as shown in FIG. 8B, is placed between the ES plate and the semiconductor package to be manufactured. For conveying the concept with simplicity, the first pattern of the first mask 1000 includes two square openings 1001, but other embodiments may have a different number of openings. The conductive element 403 has an average diameter W403 whereas the square opening 1001 has a width W1001. Considering a tolerable aligning window, the width W1001 is larger or wider than the diameter W403, so that when the ES plate is grounded, the first conductive element 403 can drop from the bottom electrode 803 through the square openings 1001 and land on a substrate 400. A solder paste or solder bump 105' may be positioned at the location of the substrate 400 on which the conductive element 403 would land prior to grounding the ES plate and allowing the first conductive element 403 to fall.

In some embodiments, opposite charges (e.g., positive charges) can be generated on the bottom electrode 803 by reversing the polarity of the ES generator 807, thereby repelling and causing a downward acceleration to the positively-charged conductive element 403. Under such operation, the directionality of the conductive element 403 placement can be controlled.

In FIG. 10A, since the two first conductive elements 403 are both landed on a first surface 401 of the substrate 400, the two first conductive elements 403 may possess substantially identical lengths in a principal axis of the rod or the needle. However, the two first conductive elements 403 are not limited to being the same length in the principal axis. A length difference between the two conductive elements 403 may be within 5% due to production variation, for example.

Figure 11A:
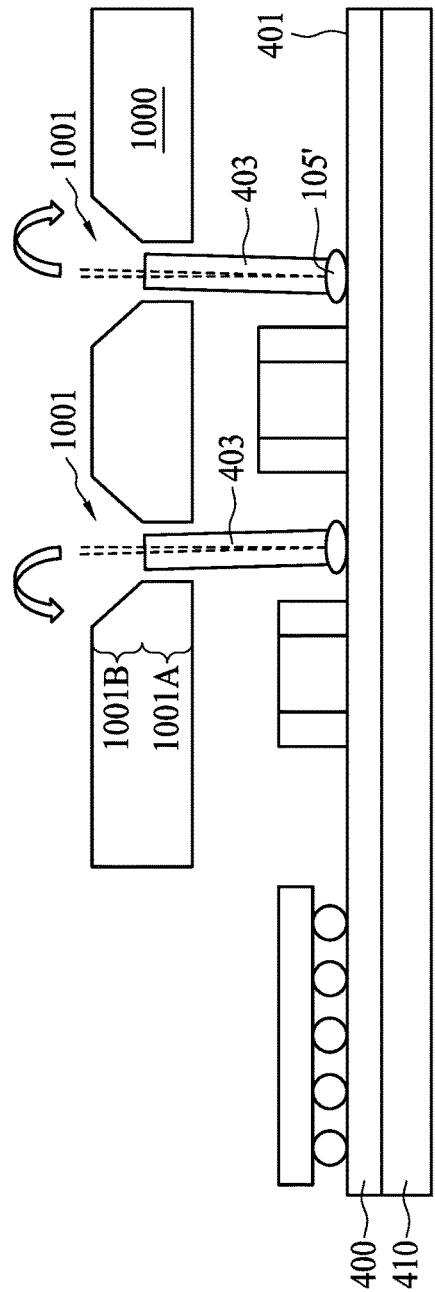
FIG. 11A illustrates a cross-sectional view of a mask, a conductive element, and a solder element during a reflow operation, in accordance with some embodiments of the present disclosure.

FIG. 11A illustrates a cross-sectional view of a first mask 1000, a first conductive element 403, and a solder element 105' during a reflow operation, in accordance with some embodiments of the present disclosure. After landing the first conductive elements 403 on the predetermined location of the semiconductor substrate 400, a reflow operation is performed to join the first conductive elements 403 to the semiconductor substrate 400 through soldering. As illustrated in FIG. 11A, the first mask 1000 is in place during the reflow operation in order to provide lateral confinement to the first conductive elements 403. A top end of the first conductive elements 403 is surrounded by a sidewall of an opening 1001 in the first mask 1000. When the solder paste or solder bump 105' reaches a molten state, the metal rod or metal needle landed thereon may lack mechanical support, and tilting/inclining may occur. With the confinement of the first mask, the extent of tilting can be controlled to be within a few degrees (e.g. within about 5 degrees), thus reaching an acute angle θ between the first conductive element 403 and first surface 401 from about 85 to less than about 90 degrees (e.g. from about 86 degrees to about 89 degrees, or from about 87 degrees to about 88 degrees), as shown in FIG. 4A. In some embodiments, the first mask 1000 is removed after the solder paste or solder bump 105' is solidified.

As shown in FIG. 11A, the opening 1001 of the mask can have a narrower neck 1001A and a wider bevel 1001B. The neck 1001A is configured to provide lateral confinement to the conductive element 403 during reflow operation whereas the bevel 1001B is configured to have a wider receiving angle for the conductive element 403 from the ES plate.

Figure 11B:
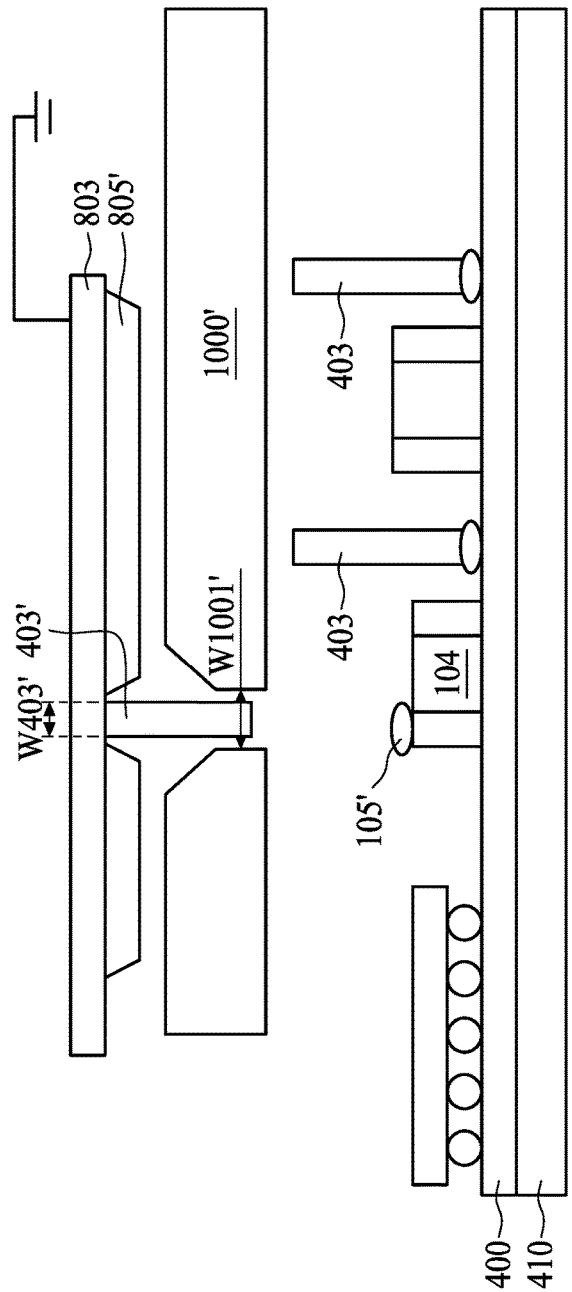
FIG. 11B illustrates a cross-sectional view of a mask, a conductive element, and a solder element a placement operation, in accordance with some embodiments of the present disclosure.

FIG. 11B illustrates a cross-sectional view of a second mask 1000', a second conductive element 403', and a solder element 105' during a placement operation, in accordance with some embodiments of the present disclosure. FIG. 11B is an optional operation where a second conductive element 403' landed on an electronic device 104 is included in the semiconductor package. Subsequent to attracting a second conductive element 403' using ES force at the bottom electrode 803, a second mask 1000' having a second pattern corresponding to the pattern of an isolation layer 805' is placed between the ES plate and the semiconductor package to be manufactured. For conveying the concept with simplicity, the first pattern of the first mask 1000 includes one opening 1001', but in other embodiments a different number of openings may be included. The second conductive element 403' has an average diameter W403' whereas the opening 1001' has a width W1001'. Considering a tolerable aligning window, the width W1001' is larger or wider than the diameter W403', so that when the ES plate is grounded, the conductive element 403' can drop from the bottom electrode 803 through the openings 1001' and land on an electronic device 104. A solder paste or solder bump 105' may be positioned at the location of the electronic device 104 on which the conductive element 403' would land prior to grounding the ES plate and allowing the second conductive element 403' to fall. In some embodiments, the second conductive element 403' is shorter than the first conductive element 403 in the principal axis by at least a height of the electronic device 104. The solder paste or solder bump 105' on the electronic device 104 can be grounded.

For the purpose of brevity, detailed description of a reflow operation after landing of the second conductive element 403' on the electronic device 104 is omitted from present disclosure, but may be implemented.

Figure 12A:
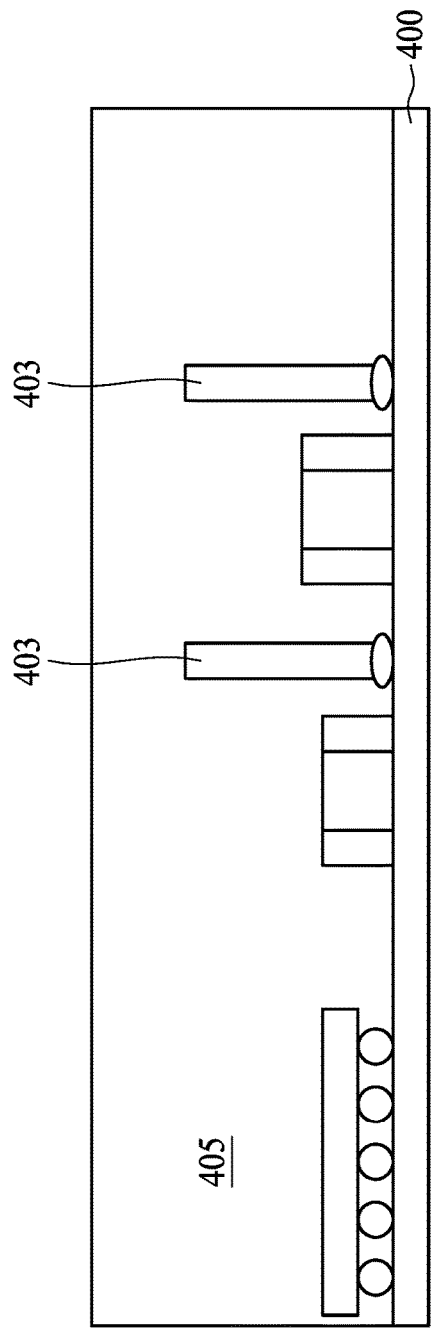
FIG. 12A is a cross-sectional view of a semiconductor package after an encapsulation operation, in accordance with some embodiments of the present disclosure.
Figure 12B:
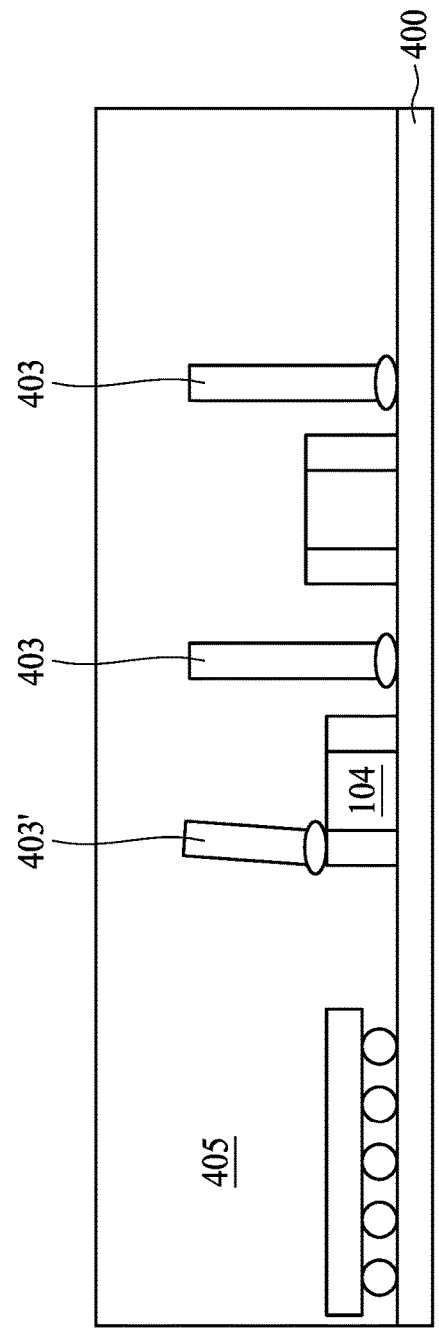
FIG. 12B is a cross-sectional view of a semiconductor package after a de-carrier operation, in accordance with some embodiments of the present disclosure.

FIG. 12A and FIG. 12B are cross-sectional views of semiconductor packages after an encapsulation operation, in accordance with some embodiments of the present disclosure. Following the placement operation in FIG. 11A and FIG. 11B, respectively, an encapsulant 405 is formed upon the first surface 401 of the semiconductor substrate 400 and fully covers the electronic devices and conductive elements 403, 403' thereon. In some embodiments, the so-formed encapsulant is casted to have a first height greater than a height of any of the electronic devices and conductive elements 403, 403'. The encapsulant operation includes using a resin sheet laminate in a softened state, a liquid resin transfer mold, coating of a liquid resin, or other suitable method, for example. Note in FIG. 12A and FIG. 12B, after the encapsulant 405 is formed, the carrier 410 supporting the semiconductor substrate 400 can be de-bonded.

Figure 13A:
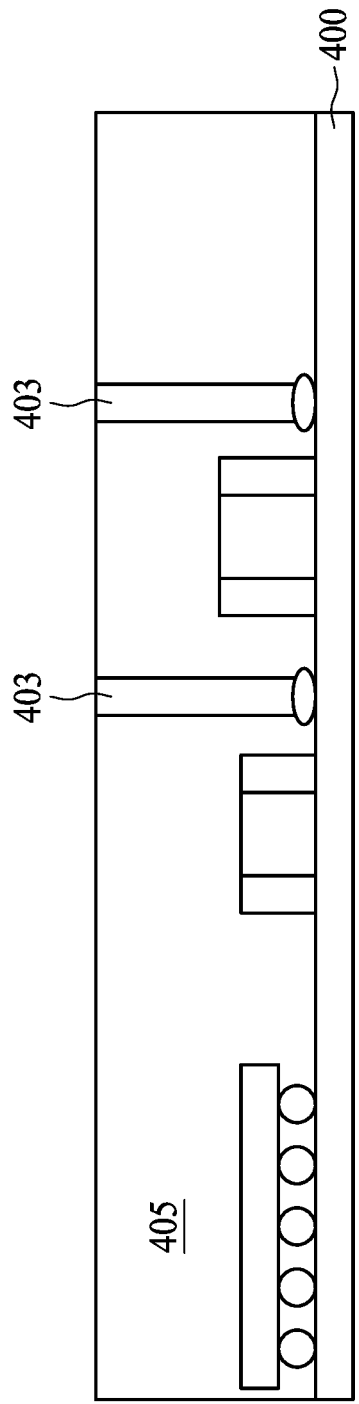
FIG. 13A is a cross-sectional view of a semiconductor package in FIG. 12A after a thinning operation, in accordance with some embodiments of the present disclosure.

FIG. 13A is a cross-sectional view of the semiconductor package of FIG. 12A after a thinning operation, in accordance with some embodiments of the present disclosure. As previously described in FIG. 12A, the height of the so-formed encapsulant 405 is greater than the height of the conductive element 403. The thinning operation may include a planarization or grinding operation that removes the encapsulant 405 from a top surface until the conductive element 403 is exposed. Referring back to FIG. 3A and FIG. 3B, the exposed conductive element 403 may have an elliptical-shaped region if the conductive element 403 is tilted or inclined during the reflow operation.

Figure 13B:
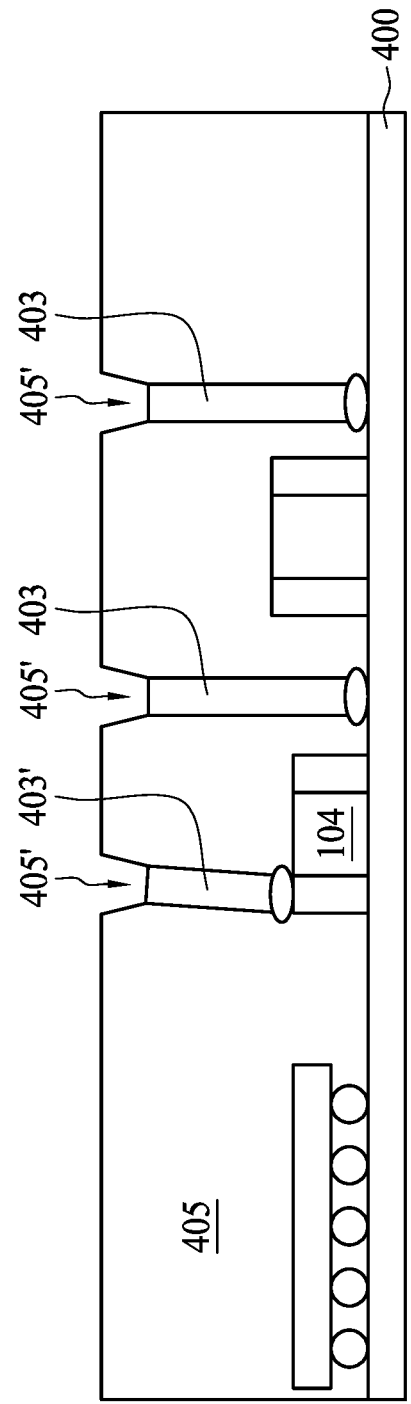
FIG. 13B is a cross-sectional view of a semiconductor package in FIG. 12B after a laser drilling operation, in accordance with some embodiments of the present disclosure.

FIG. 13B is a cross-sectional view of a semiconductor package in FIG. 12B after a laser drilling operation, in accordance with some embodiments of the present disclosure. As previously described in FIG. 12B, the height of the encapsulant 405 is greater than the height of the conductive elements 403, 403'. A laser drilling operation may form a plurality of recesses 405' on the encapsulant 405 until a top of the conductive elements 403, 403' is exposed. Optionally, a desmear operation is performed in the recesses by using a suitable chemical solution. Adjustment of laser output and the alignment of the drilling spot can be performed as appropriate. As previously discussed, laser drilling selectively removes polymeric or epoxy materials, and therefore the conductive elements 403, 403' may not be affected by laser drilling. In some embodiments, when the height of the encapsulant 405 is much greater than that of the conductive element 403, 403', a thinning operation as described in FIG. 13A is performed on the semiconductor package, followed by the laser drilling operation described in FIG. 13B.

FIG. 14A and FIG. 14B are cross-sectional views of semiconductor packages in FIG. 13A and FIG. 13B, respectively, after a half-cut and a conductive layer formation operation, in accordance with some embodiments of the present disclosure. As described herein with respect to FIG. 1A, an assembly of a plurality of semiconductor module areas 10, 20, 30, 40, 50, and 60 may be simultaneously manufactured and then the assembly be divided into individual packages. In FIG. 14A and FIG. 14B, a half-cut operation is performed to divide each semiconductor module areas 10, 20, 30, 40, 50, and 60 from the encapsulant 405 and is then followed by a formation of the conductive layer 407 over the encapsulant 405, the conductive elements 403, 403' and the semiconductor substrate 400. In some embodiments, the conductive layer 407 can include copper, stainless steel, or combinations thereof. Under such operations, the conductive layer 407 can be perceived at the first surface 401, but not a sidewall of the semiconductor substrate 400 after the full separation at the semiconductor substrate 400.

Figure 15A:
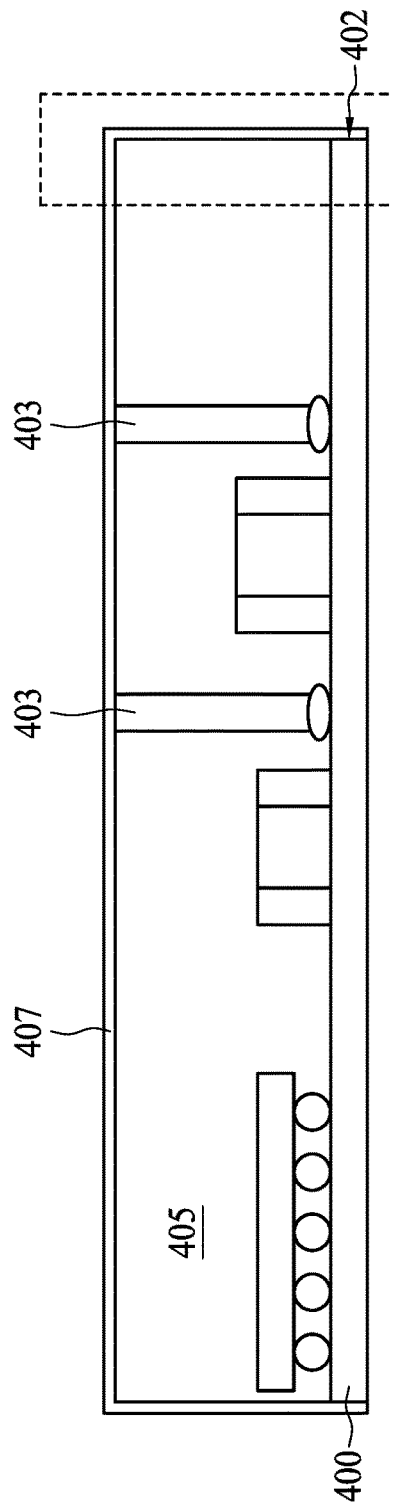
FIG. 15A is a cross-sectional view of a semiconductor package in FIG. 14A after a full-cut and a conductive layer formation operation, in accordance with some embodiments of the present disclosure.
Figure 15B:
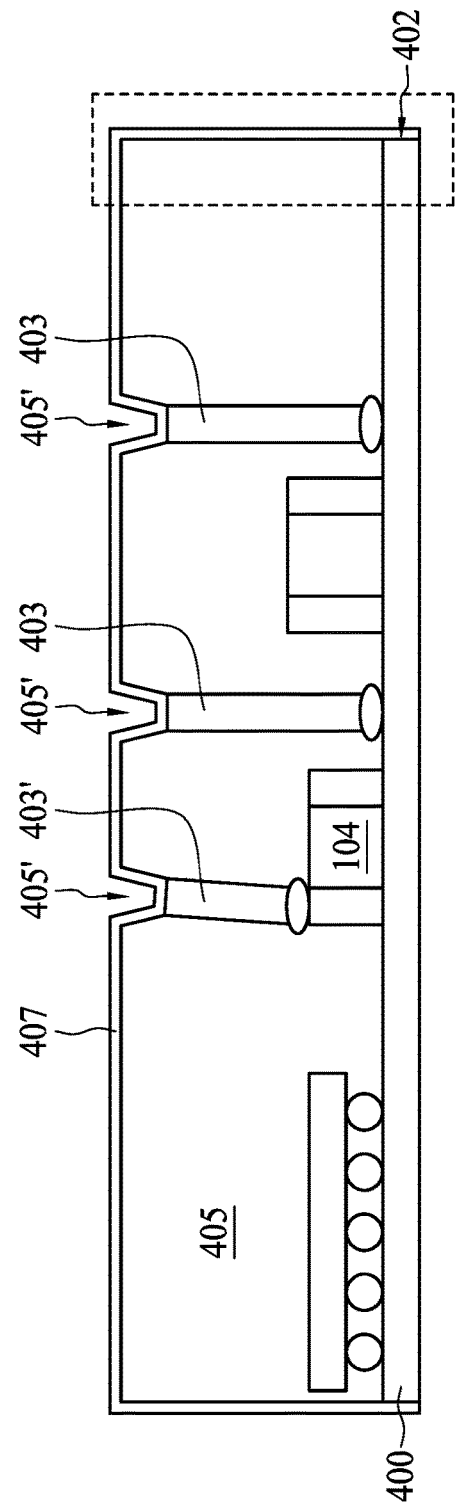
FIG. 15B is a cross-sectional view of a semiconductor package in FIG. 14B after a full-cut and a conductive layer formation operation, in accordance with some embodiments of the present disclosure.

FIG. 15A and FIG. 15B are cross-sectional views of semiconductor packages in FIG. 13A and FIG. 13B, respectively, after a full-cut and a conductive layer formation operation, in accordance with some embodiments of the present disclosure. As described herein with respect to FIG. 1A, an assembly of a plurality of semiconductor module areas 10, 20, 30, 40, 50, and 60 may be simultaneously manufactured and then the assembly be divided into individual packages. In FIG. 15A and FIG. 15B, a full-cut operation is performed to divide each semiconductor module areas 10, 20, 30, 40, 50, and 60 and is then followed by a formation of the conductive layer 407 over the encapsulant 405, the conductive elements 403, 403' and the semiconductor substrate 400. In some embodiments, the conductive layer 407 can include copper, stainless steel, or combinations thereof. Under such operations, the conductive layer 407 can be perceived at a sidewall 402 of the semiconductor substrate 400.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (µm) of lying along a same plane, such as within 10 µm, within 5 µm, within 1 µm, or within 0.5 µm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor package, comprising:
    a substrate having a surface;
    a conductive element on the surface and electrically coupled to the substrate, wherein the conductive element has a top surface facing away from the surface of the substrate and a lateral surface, and the conductive element has a principal axis forming an angle less than 90 degrees with the surface; and
    an encapsulant surrounding the lateral surface of the conductive element and covering the surface of the substrate,
    wherein a first portion of the top surface of the conductive element is covered by the encapsulant, and a second portion of the top surface of the conductive element is exposed from the encapsulant;
    wherein the top surface and the lateral surface of the conductive element define a first corner adjacent to the first portion of the top surface and a second corner adjacent to the second portion of the top surface, wherein the second corner of the conductive element is exposed from the encapsulant.

2. The semiconductor package of claim 1, further comprising a conductive layer covering the second portion of the top surface and a sidewall of the encapsulant, and electrically coupled to the substrate through the conductive element.

3. The semiconductor package of claim 1, wherein the encapsulant has a height greater than a height of the conductive element.

4. The semiconductor package of claim 1, wherein the conductive element comprises two conductive rods having different lengths.

5. The semiconductor package of claim 4, further comprising an electronic component on the surface, one of the conductive rods being electrically coupled to the substrate through the electronic component.

6. The semiconductor package of claim 1, wherein the conductive element tapers along the principal axis.

7. A semiconductor package, comprising:
    a substrate having a first surface;
    a conductive element on the first surface, wherein the conductive element has a top surface facing away from the first surface of the substrate and a side surface; and
    an encapsulant covering the side surface of the conductive element,
    wherein a first portion of the top surface of the conductive element is covered by the encapsulant, and a second portion of the top surface of the conductive element is exposed from the encapsulant,
    wherein a second surface passes through the conductive element and the encapsulant, the second surface is parallel to the first surface, and a shape of the conductive element on the second surface is elliptical;
    wherein the top surface and the side surface of the conductive element define a first corner adjacent to the first portion of the top surface and a second corner adjacent to the second portion of the top surface, wherein the second corner of the conductive element is exposed from the encapsulant.

8. The semiconductor package of claim 7, further comprising a conductive layer covering a top surface of the encapsulant and the second portion of the top surface of the conductive element.

9. The semiconductor package of claim 8, wherein the top surface of the encapsulant is higher than the top surface of the conductive element.

10. The semiconductor package of claim 9, wherein a portion of the conductive layer covers the conductive element and defines a kink.

11. The semiconductor package of claim 9, wherein a portion of the conductive layer covers the conductive element and has a slanted surface.

12. The semiconductor package of claim 7, wherein the conductive element comprises two conductive rods having different lengths.

13. The semiconductor package of claim 12, further comprising an electronic component on the first surface, one of the conductive rods being electrically coupled to the substrate through the electronic component.

14. A method for manufacturing a semiconductor package, comprising:
   providing a substrate, the substrate having a surface; and
   placing a conductive element having a principal axis on the surface of the substrate by performing processes that comprise:
      picking the conductive element using an electrostatic force;
      releasing the conductive element on a position on the surface of the substrate; and
   forming an encapsulant on the surface of the substrate, wherein a first corner adjacent to a top surface of the conductive element is covered by the encapsulant and a second corner adjacent to the top surface of the conductive element is exposed from the encapsulant.

15. The method of claim 14, wherein placing the conductive element on the surface of the substrate further comprises:
   providing a patterned mask having an opening; and
   passing the conductive element through the opening thereby disposing the conductive element at the position.

16. The method of claim 14, further comprising:
   disposing solder paste at the position on the surface of the substrate prior to placing the conductive element on the surface of the substrate; and
   reflowing the solder paste.

17. The method of claim 14, further comprising:
   forming a conductive layer on the encapsulant and the top surface of the conductive element.

18. The semiconductor package of claim 1, further comprising:
   a bumping structure between the surface of the substrate and the conductive element, the bumping structure having an interface in contact with the conductive element.

19. The semiconductor package of claim 1, further comprising a conductive layer covering the second corner of the conductive element.

20. The semiconductor package of claim 19, wherein the conductive layer covers a portion of the lateral surface of the conductive element.

* * * * *